United States Patent
Rivero et al.

(10) Patent No.: US 10,177,101 B2
(45) Date of Patent: Jan. 8, 2019

(54) METHOD FOR FORMING AT LEAST ONE ELECTRICAL DISCONTINUITY IN AN INTEGRATED CIRCUIT, AND CORRESPONDING INTEGRATED CIRCUIT

(71) Applicant: STMicroelectronics (Rousset) SAS, Rousset (FR)

(72) Inventors: Christian Rivero, Rousset (FR); Pascal Fornara, Pourrieres (FR); Guilhem Bouton, Peynier (FR); Mathieu Lisart, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/596,767

(22) Filed: May 16, 2017

(65) Prior Publication Data
US 2018/0145040 A1    May 24, 2018

(30) Foreign Application Priority Data
Nov. 22, 2016 (FR) .................................. 16 61347

(51) Int. Cl.
*H01L 23/00* (2006.01)
*H01L 21/311* (2006.01)
(Continued)

(52) U.S. Cl.
CPC ...... *H01L 23/573* (2013.01); *H01L 21/31111* (2013.01); *H01L 21/768* (2013.01);
(Continued)

(58) Field of Classification Search
CPC ............. H01L 23/573; H01L 21/31111; H01L 23/5283; H01L 24/03; H01L 24/06; H01L 27/088; H01L 29/66583; H01L 29/66606; H01L 29/7809; H01L 29/806; H01L 28/7839
See application file for complete search history.

(56) References Cited

U.S. PATENT DOCUMENTS

| 6,791,191 B2 | 9/2004 | Chow et al. |
| 7,402,514 B2 | 7/2008 | Tsu et al. |

(Continued)

FOREIGN PATENT DOCUMENTS

| DE | 69715472 T2 | 4/2003 |
| DE | 102013224060 A1 | 5/2015 |

(Continued)

OTHER PUBLICATIONS

INPI Search Report and Written Opinion for FR 1661347 dated Oct. 17, 2017 (7 pages).

*Primary Examiner* — Shahed Ahmed
(74) *Attorney, Agent, or Firm* — Crowe & Dunlevy

(57) ABSTRACT

An integrated circuit includes a semiconductor substrate and a multitude of electrically conductive pads situated between component zones of the semiconductor substrate and a first metallization level of the integrated circuit, respectively. The multitude of electrically conductive pads are encapsulated in an insulating region and include: first pads, in electrical contact with corresponding first component zones, and at least one second pad, not in electrical contact with a corresponding second component zone.

10 Claims, 5 Drawing Sheets

(51) Int. Cl.
*H01L 23/528* (2006.01)
*H01L 27/088* (2006.01)
*H01L 23/522* (2006.01)
*H01L 23/58* (2006.01)
*H01L 21/768* (2006.01)

(52) U.S. Cl.
CPC ...... *H01L 21/76816* (2013.01); *H01L 23/522* (2013.01); *H01L 23/5226* (2013.01); *H01L 23/5283* (2013.01); *H01L 23/585* (2013.01); *H01L 24/03* (2013.01); *H01L 24/06* (2013.01); *H01L 27/088* (2013.01); *H01L 21/76802* (2013.01)

(56) References Cited

U.S. PATENT DOCUMENTS

| | | |
|---|---|---|
| 9,502,405 B1 * | 11/2016 | Cao .................. G06F 21/73 |
| 2008/0174022 A1 | 7/2008 | Chen et al. |
| 2008/0293242 A1 | 11/2008 | Cooney, III et al. |
| 2009/0111257 A1 | 4/2009 | Hsu et al. |
| 2010/0155846 A1 * | 6/2010 | Mukherjee ........ H01L 21/28512 257/365 |
| 2016/0254227 A1 | 9/2016 | Leobandung |

FOREIGN PATENT DOCUMENTS

| | | |
|---|---|---|
| JP | S61147551 A | 7/1986 |
| JP | 2008205019 A | 9/2008 |
| WO | WO-9857373 A1 | 12/1998 |

* cited by examiner

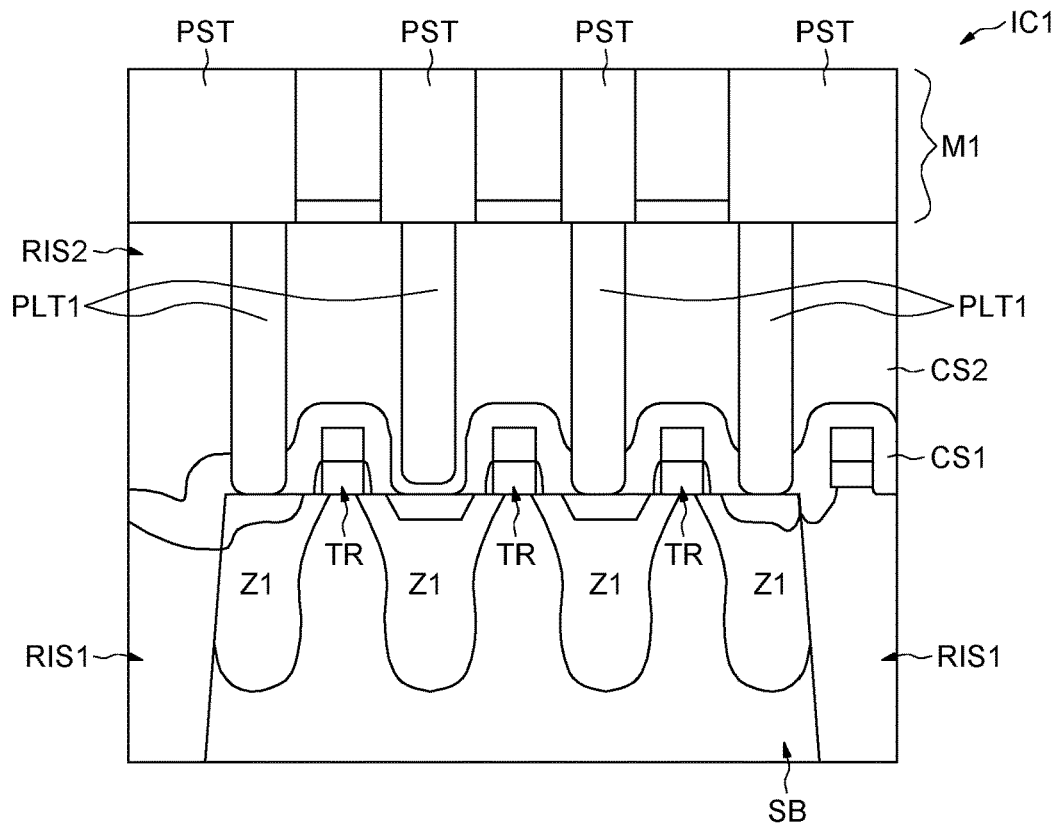
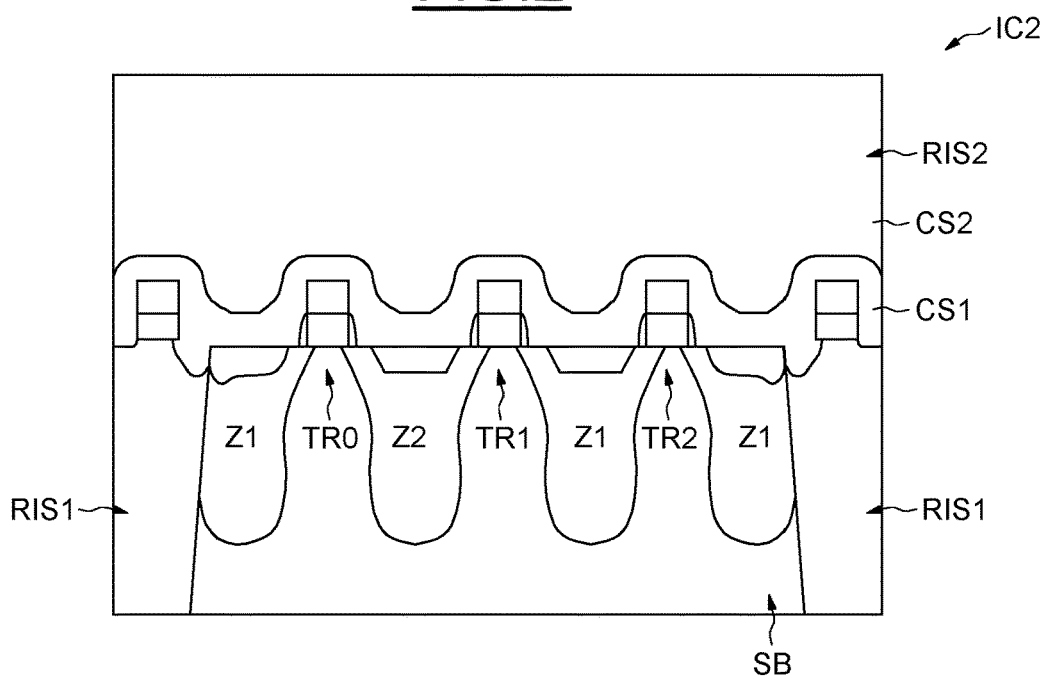

METHOD FOR FORMING AT LEAST ONE ELECTRICAL DISCONTINUITY IN AN INTEGRATED CIRCUIT, AND CORRESPONDING INTEGRATED CIRCUIT

PRIORITY CLAIM

This application claims the priority benefit of French Application for Patent No. 1661347, filed on Nov. 22, 2016, the disclosure of which is hereby incorporated by reference in its entirety.

TECHNICAL FIELD

Modes of implementation and embodiments relate to integrated circuits, and more particularly to the protection thereof from reverse engineering carried out on the basis of photographic top views of various layers of the integrated circuit.

BACKGROUND

There is a need in the art for an integrated circuit structure, and a manufacturing method for such an integrated circuit structure, that would make the automatic pattern recognition used during reverse engineering complicated if not almost impossible. In particular, this could be accomplished by structure and manufacturing method that results in an increase in the extraction error rate for reverse engineering so as to make it almost impossible to extract the description (netlist) of the integrated circuit from a top view of the layout.

SUMMARY

In this respect, what is proposed in particular is to produce at least one electrical discontinuity in the integrated circuit at the bottom end of the electrically conductive pads (commonly referred to as contacts by those skilled in the art) connecting component zones, for example transistor source or drain regions, to the first metallization level of the interconnect part (commonly referred to by the acronym BEOL (for back end of line) by those skilled in the art) of the integrated circuit.

Thus, according to one aspect, what is proposed is a method for forming at least one electrical discontinuity in an integrated circuit, comprising the production, above a semiconductor substrate, of a multitude of electrically conductive pads (contacts) situated between component zones of the integrated circuit and a first metallization level of the integrated circuit, respectively, and encapsulated in an insulating region, said multitude of pads including first pads, in electrical contact with corresponding first component zones, and at least one second pad, not in electrical contact with a corresponding second component zone, so as to form said at least one electrical discontinuity.

Thus, such an electrical discontinuity, produced at the bottom end of at least one pad situated opposite the corresponding component zone, for example the drain zone of a transistor, is almost, if not completely, undetectable in a photograph taken from above, and makes it possible for example to make it appear that a transistor is electrically operational whereas in fact it is for example permanently OFF, that is to say operationally inactive, because of the presence of this discontinuity.

According to one mode of implementation, said production comprises:

initial production of the first pads encapsulated in said insulating region, localized etching of said insulating region at the location of said at least one second pad, so as to form at least one orifice leading to said corresponding second component zone, lining the internal wall of said at least one orifice and said second component zone with an insulating layer having a composition identical to that of at least one part of said insulating region, and filling said at least one lined orifice with a filler material having a composition identical to that of the first pads, so as to form said at least one second pad.

The fact that the insulating layer that lines the orifice and the second component zone have a composition identical to that of a part of the insulating region will make it particularly difficult to discriminate between a second pad and a first pad.

Thus, by way of example, the insulating region may include a first insulating layer, for example of silicon carbon nitride (SiCN), covered with a second insulating layer, for example of tetraethyl orthosilicate (TEOS), or else a material having a low dielectric constant, such as $SiO_2$ or even SiOC. This second insulating layer is, for example, better known as the PMD (pre-metal dielectric) layer by those skilled in the art.

In this case, the insulating layer that lines the internal wall of the orifice and the second component zone may also be formed of a material having a composition identical to that of the material of the second insulating layer.

Likewise, the filling of the lined orifice with a filler material having a composition identical to that of the first pads also makes it difficult to discriminate between a first pad and a second pad.

This filler material may comprise tungsten, for example.

In order to make this discrimination even more difficult, said localized etching and said lining are configured to make said at least one lined orifice such that its aperture size leads, after filling thereof, to said at least one second pad having a cross section of a size analogous to that of the cross section of each first pad.

In other words, prior to lining, the orifice is slightly larger than the orifice used to form the first pads, and this size and the thickness of the lining layer are chosen so as ultimately to obtain a contact (pad) size that is analogous for all of the pads, whether these pads be first pads or second pads.

The term 'analogous' is here understood to mean identical or substantially identical, to within manufacturing tolerances.

Said at least one second component zone may comprise an active region of a transistor, for example the drain region. That being said, this example is in no way restrictive, and any component zone may be envisioned, such as, for example, a polysilicon line, for forming said electrical discontinuity.

According to another aspect, what is proposed is an integrated circuit comprising, above a semiconductor substrate, a multitude of electrically conductive pads situated between component zones of the integrated circuit and a first metallization level of the integrated circuit, respectively, and encapsulated in an insulating region, said multitude of pads including first pads, in electrical contact with corresponding first component zones, and at least one second pad, not in electrical contact with a corresponding second component zone, so as to form at least one electrical discontinuity.

According to one embodiment, said at least one second pad is completely embedded in said insulating region, a part of said insulating region being situated between said at least one second component zone and a bottom end of said at least one second pad.

According to one embodiment, said at least one second pad has a cross section of a size analogous to that of the cross section of each first pad.

According to another aspect, what is proposed is an object, for example a chip card or an electronic appliance, such as for example a cellular mobile telephone or a tablet, including an integrated circuit such as defined hereinabove.

BRIEF DESCRIPTION OF THE DRAWINGS

Other advantages and features of the invention will become apparent on examining the detailed description of modes of implementation and embodiments, which are in no way limiting, and the appended drawings, in which:

FIG. 1 illustrates an example of an integrated circuit from the prior art;

FIGS. 2 to 9 schematically illustrate an example of a method according to the invention and an example of an integrated circuit.

DETAILED DESCRIPTION

In FIG. 1, the reference IC1 denotes an example of an integrated circuit from the prior art.

This integrated circuit IC1 includes, in a conventional manner, a semiconductor substrate SB, as well as insulating regions RIS1, for example shallow trench isolations (STIs) that bound a substrate region inside of which are, for example, formed active component zones Z1. These components here include, for example, transistors TR, the zones Z1 then forming source or drain regions of these transistors.

The components of the integrated circuit are separated from the first metallization level M1 by an insulating region RIS2 including, here, a first insulating layer CS1, for example made of SiCN, surmounted by a second insulating layer CS2, for example made of a material such as $SiO_2$.

The component zones Z1 are connected to metal tracks PST of the first metallization level M1 by first pads PLT1, commonly referred to as contacts by those skilled in the art. These pads PLT1 are electrically conductive, for example made of tungsten, and are encapsulated in the insulating region RIS2.

Reference is now made to FIGS. 2 to 9 in order to describe an example of a manufacturing method making it possible to create at least one electrical discontinuity in the integrated circuit.

In FIG. 2, the integrated circuit IC2 has been shown at a manufacturing stage in which the various components, here including, for example, MOS transistors TR0, TR1 and TR2, have been produced in a manner that is conventional and known per se and then subsequently encapsulated in the insulating region RIS2, including the first insulating layer CS1, for example made of SiCN, surmounted by the second insulating layer CS2, for example of $SiO_2$, also known as the pre-metal dielectric by those skilled in the art.

In FIG. 2, among the component zones, for example here the source and drain regions of the transistors, there is a differentiation between first component zones Z1 and a second component zone Z2.

As will be seen in more detail hereinafter, it is level with this second component zone Z2 that an electrical discontinuity will be created in the integrated circuit IC2.

Figure 3:
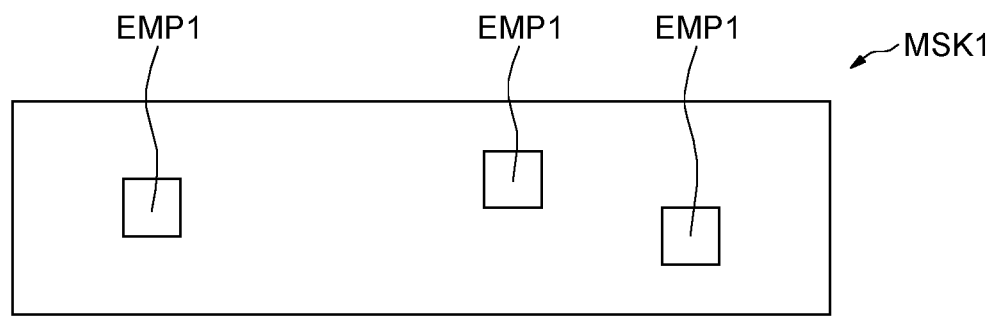

In the following step, illustrated in FIGS. 3 and 4, the first pads PLT1 encapsulated in the insulating region RIS2 are formed.

These first pads PLT1 make contact with the first component zones Z1 by way, as is conventional, of silicided parts of these zones Z1.

These first pads PLT1 have been produced in a manner that is conventional and known per se by initial localized etching of the insulating region RIS2 using a first mask MSK1 (FIG. 3) that delineates the locations (mask openings) EMP1 of the orifices intended to be etched into the insulating layer RIS2 in order to subsequently be filled with a filler material, for example tungsten, so as to form the pads PLT1.

In contrast, this mask MSK1 does not include the location of the future second pad, which will be situated facing the second component zone Z2.

Figure 4:
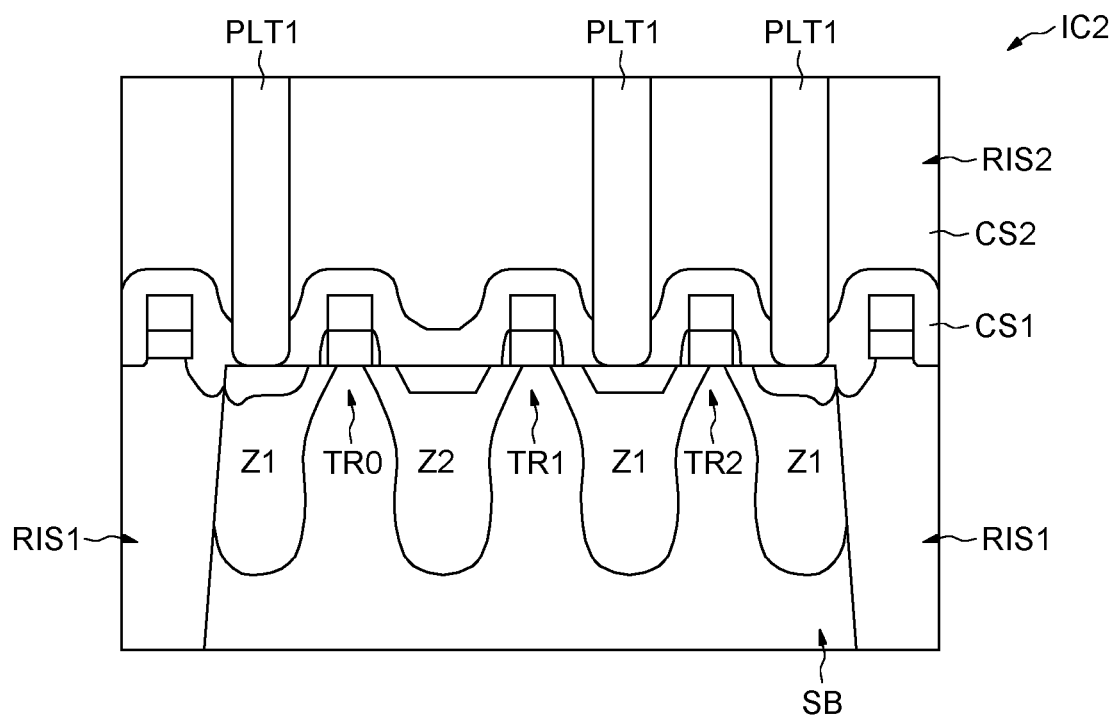

Consequently, the corresponding part of the insulating region RIS2 is not etched (FIG. 4).

Figure 5:
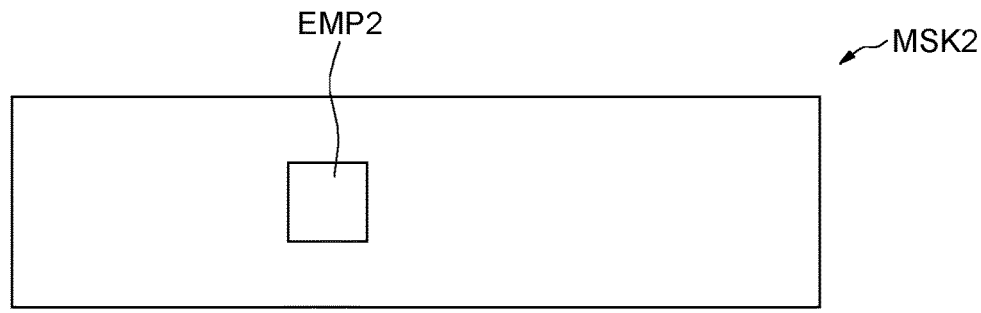
Figure 6:
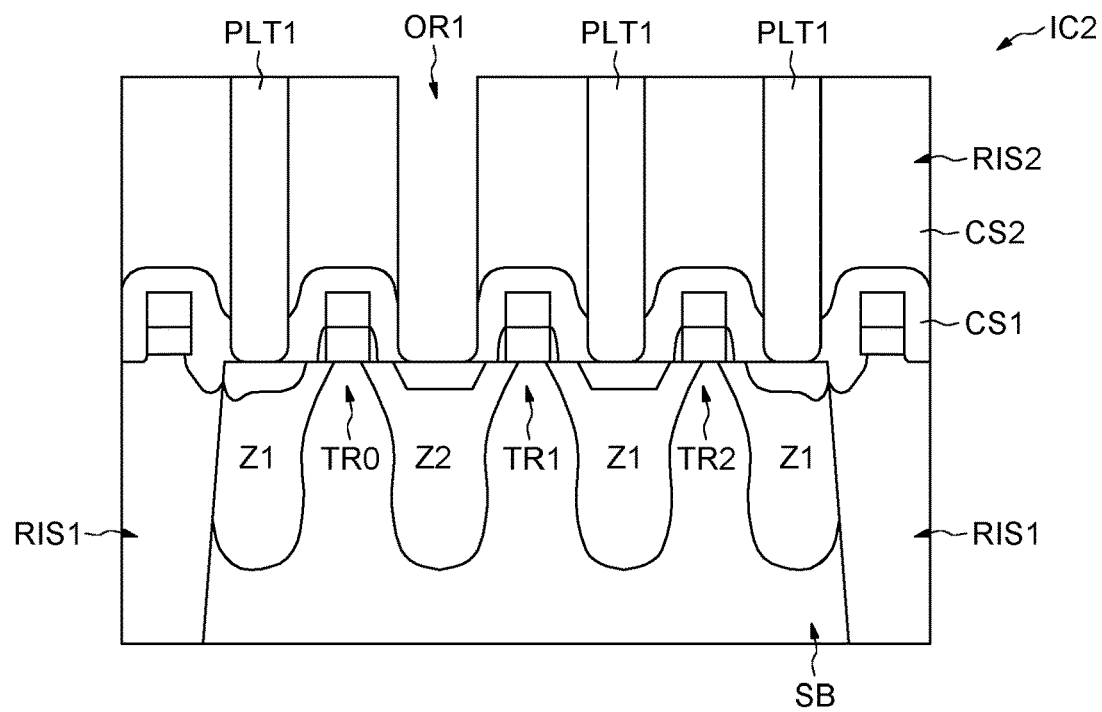

Then, as illustrated in FIGS. 5 and 6, a second localized etching of the insulating region RIS2 is carried out above the second component zone Z2 so as to form an orifice OR1 leading to this second component zone Z2.

This second localized etching is carried out using a second mask MSK2 (FIG. 5) that this time delineates the location (mask opening) EMP2 of the orifice OR1. By comparing FIG. 5 with FIG. 3, it will be noted that a cross-sectional area of the mask opening EMP2 is larger than a cross-sectional area of the mask opening EMP1.

Correspondingly, as can be seen in FIG. 6, the size of a cross section of the orifice OR1 is larger than the size of a cross section of a pad PLT1 (and its corresponding opening that was filled with metal material).

Specifically, although this is not essential, but even more effective from a reverse engineering point of view, it is preferable to enlarge this orifice OR1 so as to ultimately obtain, as will be seen in more detail hereinafter, a second pad (contact) above this zone Z2, the size of the cross section of which is analogous, that is to say identical or substantially identical, to within a manufacturing tolerance, to the size of a cross section of a first pad PLT1.

Figure 7:
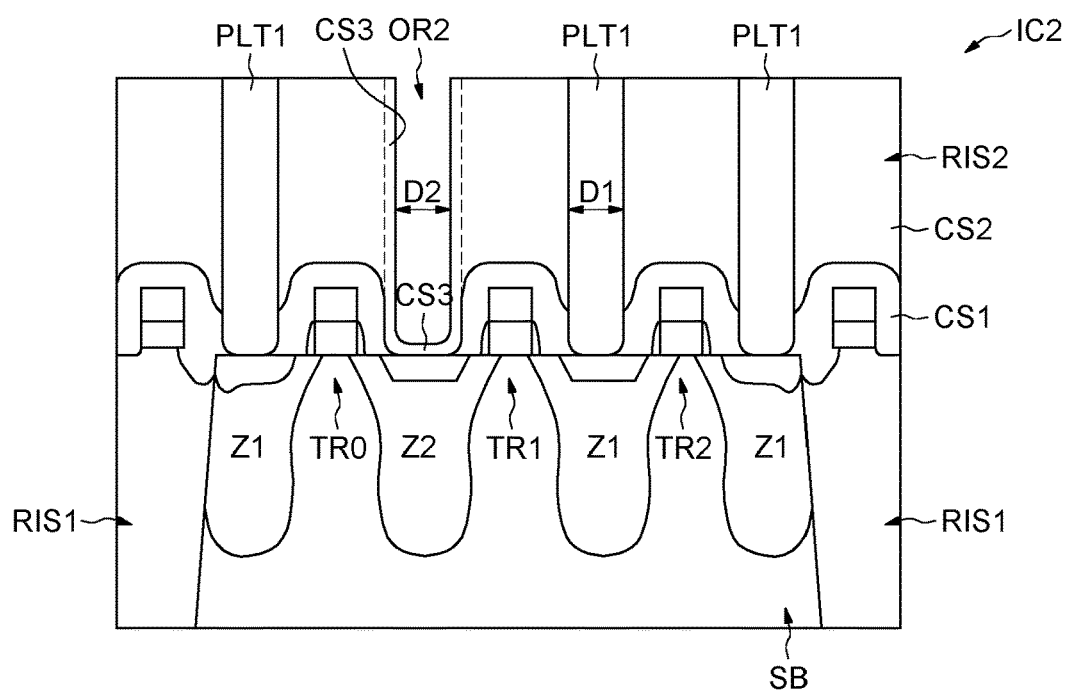

In this respect, as illustrated in FIG. 7, the internal wall of the orifice OR1, as well as the component zone Z2, are lined with an insulating layer CS3 advantageously having a composition identical to that of the second insulating layer CS2. Thus, for example, the insulating layer CS3 may be a deposited $SiO_2$ layer to match the material used for the second insulating layer CS2. Any suitable process for a conformal layer or lining deposit of insulating material may be used.

The size of the orifice OR1 and the thickness of the insulating layer CS3 are chosen such that the size D2 of a cross section of the thus-lined orifice OR2 is analogous to the size D1 of a cross section of a first pad PLT1.

Figure 8:
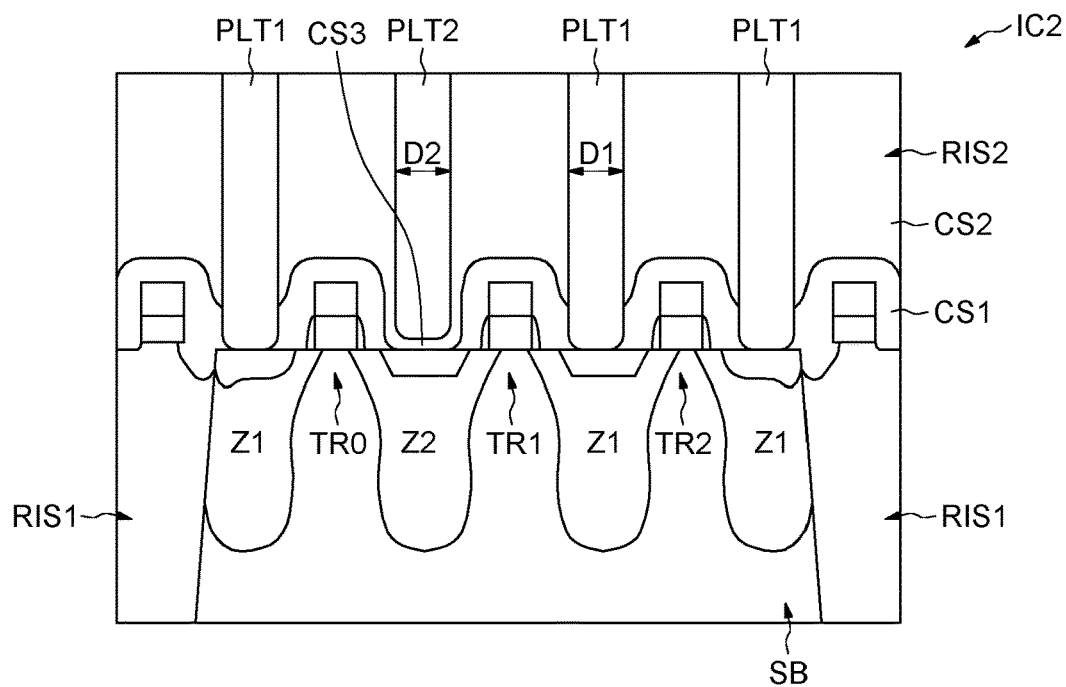

Then, as illustrated in FIG. 8, the lined orifice OR2 is filled, in a manner that is conventional and known per se, with a filler material identical to that forming the pads PLT1, thereby making it possible to obtain a second pad PLT2 having a composition analogous to that of the pads PLT1 and having a cross-section size D2 analogous to the size D1 of the cross section of a pad PLT1.

However, as illustrated in FIG. 8, the bottom end of the second pad PLT2 is located a distance away from the second component zone Z2 and is separated therefrom by the insulating layer CS3. Consequently, the second pad PLT2 is not in electrical contact with the zone Z2, thus creating an electrical discontinuity in the integrated circuit.

Thus, if, for example, the second component zone Z2 is the drain of the transistor TR0, this transistor TR0 will be permanently electrically OFF, whereas, seen from above, it appears to be a conventional transistor.

Figure 9:
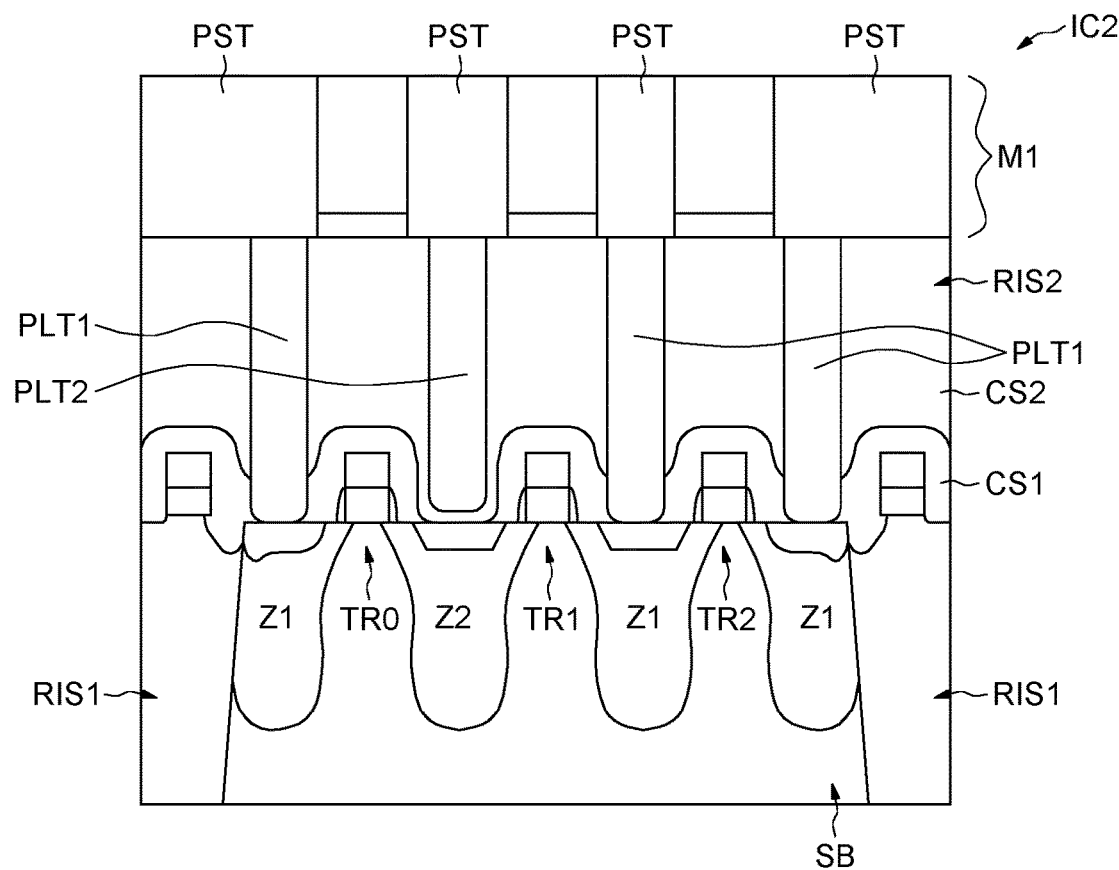

Then, as illustrated in FIG. 9, the first metallization level M1, including the metal tracks PST encapsulated in an inter-track dielectric, is produced in a manner that is conventional and known per se.

The method for manufacturing the integrated circuit, that is to say in particular the production of the upper metallization level, is subsequently continued in a conventional manner.

What is therefore obtained, as illustrated in FIG. 9, is an integrated circuit IC2 here having an electrical discontinuity.

More precisely, the integrated circuit IC2 includes a multitude of electrically conductive pads situated between component zones of the integrated circuit and the first metallization level M1, respectively, and encapsulated in the insulating region RIS2.

This multitude of pads includes first pads PLT1, in electrical contact with corresponding first component zones Z1, and at least one second pad PLT2, not in electrical contact with a corresponding second component zone Z2, so as to form said at least one electrical discontinuity.

The second pad PLT2 is completely embedded in the insulating region RIS2, a part of the insulating region, in the present case the layer CS3, being situated between the second component zone Z2 and a bottom end of this second pad PLT2.

As indicated hereinabove, this second pad PLT2 advantageously has a cross section of a size analogous to that of the cross section of each first pad, and a composition analogous to that of the first pads.

Figure 10:
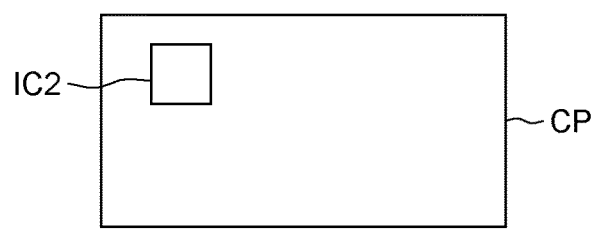
FIG. 10 schematically illustrates a chip card.

Such an integrated circuit IC2 may be incorporated into any object, in particular a chip card CP as illustrated very schematically in FIG. 10.

In order to be even more effective from a reverse engineering point of view (that is to say to make reverse engineering even more complicated), it would also be possible to create at least one other electrical discontinuity in the interconnect (BEOL) part of the integrated circuit, for example by using the teachings of the French Application for Patent No. 1661348 filed Nov. 22, 2016 and entitled "Method for forming at least one electrical discontinuity in an interconnect part of an integrated circuit, and corresponding integrated circuit", and/or the teachings of the French Application for Patent No. 1661346 filed Nov. 22, 2016 and entitled "Method for forming at least one electrical discontinuity in an interconnect part of an integrated circuit without the addition of supplementary material, and corresponding integrated circuit", the disclosures of which are incorporated herein by reference.

The invention claimed is:

1. An integrated circuit, comprising:
    a semiconductor substrate including source-drain regions of the integrated circuit;
    a multitude of electrically conductive pads situated between said source-drain regions and a first metallization level of the integrated circuit, respectively;
    an insulating region encapsulating said multitude of electrically conductive pads; and
    wherein said multitude of electrically conductive pads include:
        a first pad in electrical contact with a corresponding first source-drain region;
        a second pad that is not in electrical contact with a corresponding second source-drain region so as to form at least one electrical discontinuity;
    wherein the first source-drain region and the second source-drain region form a portion of a transistor; and
    wherein the at least one electrical discontinuity between the second pad and the second source-drain region is dimensioned such that the transistor is permanently electrically turned off.

2. The integrated circuit according to claim 1, wherein a part of said insulating region extends between said second source-drain region and a bottom end of said second pad.

3. The integrated circuit according to claim 1, wherein said second pad has a cross-sectional size that is analogous to a cross-sectional size of the first pad.

4. The integrated circuit according to claim 1, wherein the integrated circuit is a component of an object.

5. The integrated circuit according to claim 4, wherein the object is a chip card.

6. The integrated circuit according to claim 1, wherein said first metallization level includes a first metal line in electrical contact with the first electrical pad and a second electrical line in electrical contact with the second electrical pad.

7. An integrated circuit, comprising:
    a semiconductor substrate including source-drain regions;
    a first metallization level of the integrated circuit;
    a multitude of electrically conductive pads situated between the source-drain regions and the first metallization level;
    an insulating region which encapsulates the multitude of electrically conductive pads;
    wherein a first pad of said multitude of electrically conductive pads is electrically connected with a corresponding first source drain region; and
    a second pad insulated from electrical contact with a corresponding second source-drain region so as to form at least one electrical discontinuity.

8. The integrated circuit according to claim 7, further comprising:
    at least one orifice in said insulating region at a location of said second pad, said at least one orifice leading to said corresponding second source-drain region;
    an insulating layer lining an internal wall of said at least one orifice and said source-drain region, wherein the insulating layer has a material composition identical to that of a part of said insulating region; and
    a filler material that fills said at least one orifice lined with the insulating layer and forms said second pad, said filler material having a material composition identical to that of the first pad.

9. The integrated circuit according to claim 8, wherein said at least one orifice lined with the insulating layer has a cross-sectional size such that said second pad has a cross-sectional size analogous to a cross-sectional size of the first pad.

10. The integrated circuit according to claim 7, wherein said first metallization level over the insulating region includes a first metal line in electrical contact with the first and a second electrical line in electrical contact with the second pad.

* * * * *

UNITED STATES PATENT AND TRADEMARK OFFICE
CERTIFICATE OF CORRECTION

PATENT NO. : 10,177,101 B2
APPLICATION NO. : 15/596767
DATED : January 8, 2019
INVENTOR(S) : Christian Rivero et al.

Page 1 of 1

It is certified that error appears in the above-identified patent and that said Letters Patent is hereby corrected as shown below:

In the Claims

At Column 6, Claim number 10, Lines 63 thru 64, please replace the phrase [[ the first and a second ]] with the phrase -- the first pad and a second --.

Signed and Sealed this
Eighteenth Day of June, 2019

Andrei Iancu
*Director of the United States Patent and Trademark Office*